(12) United States Patent
Smith et al.

(10) Patent No.: US 8,258,027 B2
(45) Date of Patent: Sep. 4, 2012

(54) METHOD FOR INTEGRATING SONOS NON-VOLATILE MEMORY INTO A STANDARD CMOS FOUNDRY PROCESS FLOW

(75) Inventors: Joseph Terence Smith, Columbia, MD (US); Dennis A. Adams, Gambrills, MD (US); Patrick Bruckner Shea, Washington, DC (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 78 days.

(21) Appl. No.: 12/941,645

(22) Filed: Nov. 8, 2010

(65) Prior Publication Data
US 2012/0115292 A1    May 10, 2012

(51) Int. Cl.
*H01L 21/8238* (2006.01)

(52) U.S. Cl. ......................................................... 438/200
(58) Field of Classification Search .................. None
See application file for complete search history.

(56) References Cited

U.S. PATENT DOCUMENTS 6,946,349 B1   9/2005 Lee
7,361,560 B2   4/2008 Lee

*Primary Examiner* — Scott B Geyer
(74) *Attorney, Agent, or Firm* — Andrews Kurth LLP

(57) ABSTRACT

An embodiment of a method is disclosed to integrate silicon oxide nitride oxide silicon (SONOS) non-volatile memory (NVM) into a conventional complementary metal oxide semiconductor (CMOS) semiconductor foundry process flow. An embodiment of the method only adds a few additional steps to a standard CMOS foundry process flow and makes minor changes to the rest of the baseline CMOS foundry process flow to form a new process module that includes both CMOS devices and an embedded SONOS NVM.

20 Claims, 6 Drawing Sheets

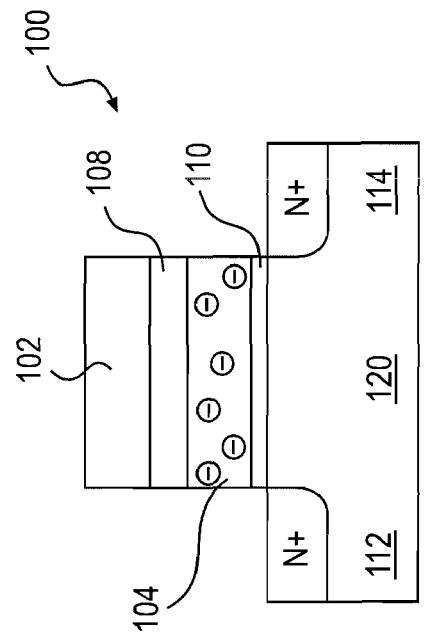
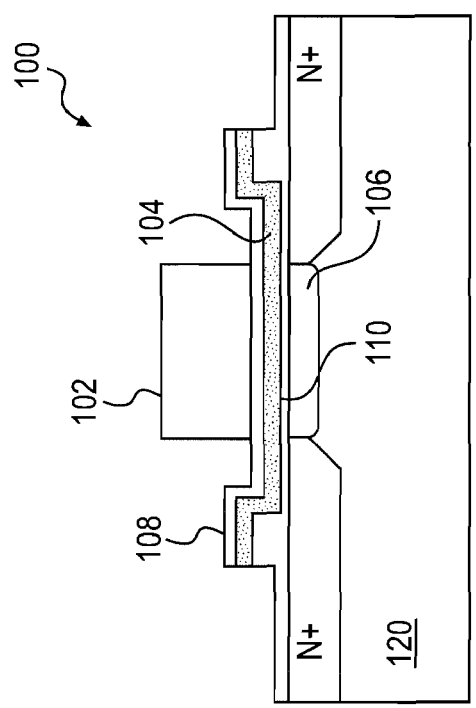

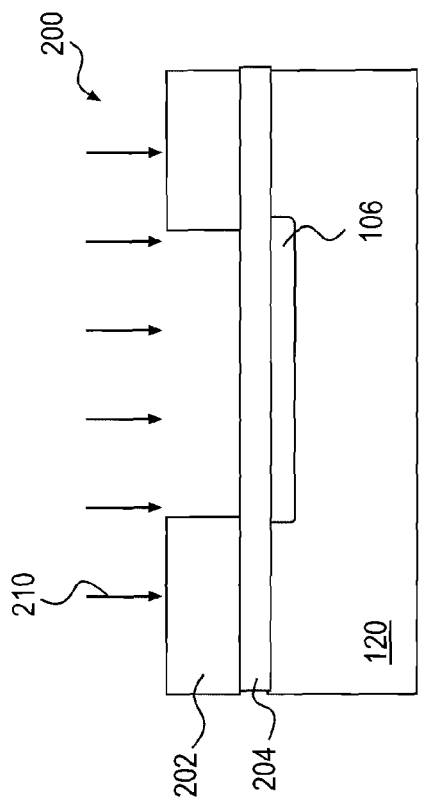
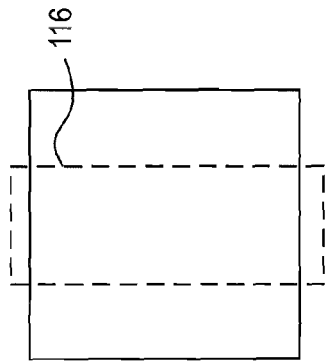
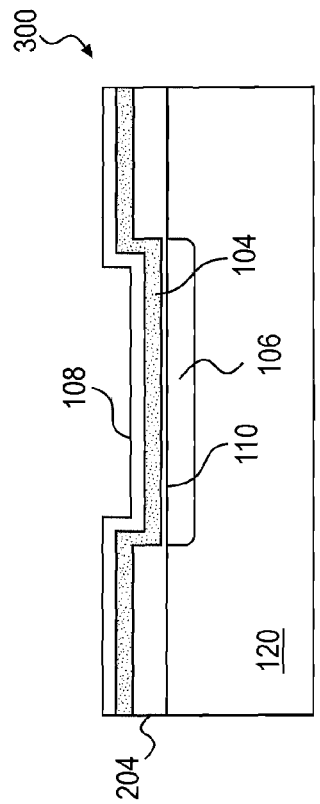
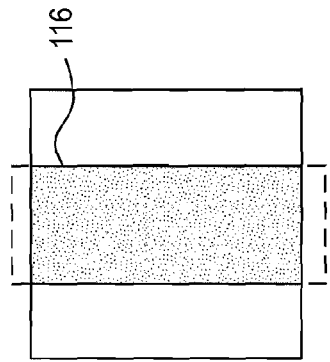

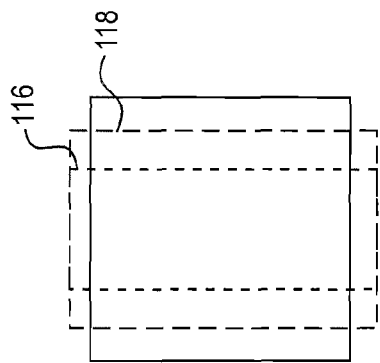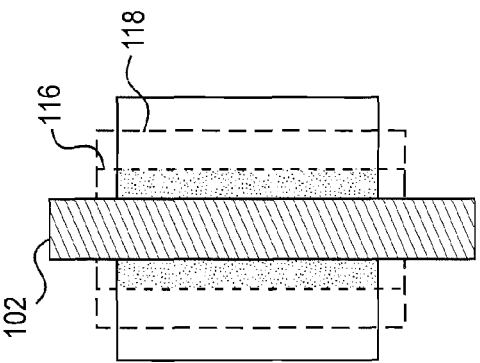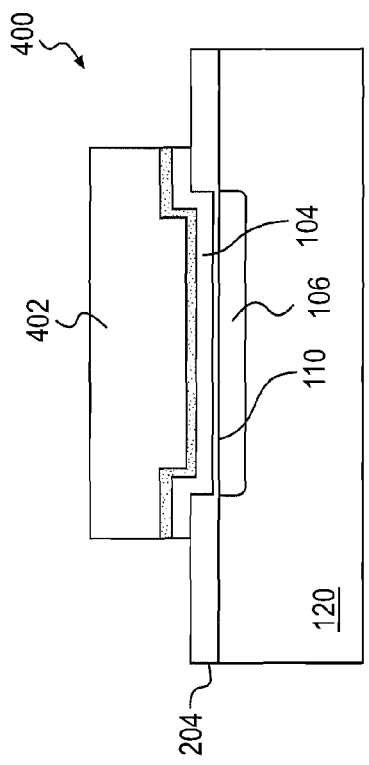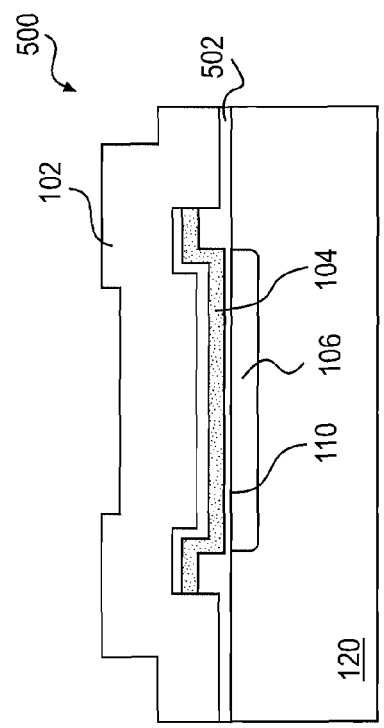

METHOD FOR INTEGRATING SONOS NON-VOLATILE MEMORY INTO A STANDARD CMOS FOUNDRY PROCESS FLOW

BACKGROUND

The fabrication of non-volatile memory (NVM) devices may be integrated into a complementary metal oxide semiconductor (CMOS) foundry process flow. The current state of the art integrates the more complicated floating gate NVM foundry process into foundry process flow for technologies such as field-programmable gate arrays (FPGAs). Recent interest and trends redirect interest towards silicon oxide nitride oxide silicon (SONOS) NVM because of its limited additional process burden and the ability to program (and erase) SONOS NVM at lower voltages.

Examples of embedding SONOS NVM into a CMOS foundry process flow are described in, for example, U.S. Pat. No. 6,946,349, entitled "Method for Integrating a SONOS Gate Oxide Transistor into a Logic/Analog Integrated Circuit Having Several Gate Oxide Thicknesses" (the '349 patent) and U.S. Pat. No. 7,361,560, entitled "Method of Manufacturing a Dielectric Layer in a Memory Device that Includes Nitriding Step" (the '560 patent). However, these patents merely describe the basic concept of embedding SONOS without showing how SONOS NVMs are embedded into a standard CMOS foundry process with the least amount of processing overhead or burden on the standard CMOS foundry process. None of the methods described in these patents or elsewhere teach how to minimize process overhead or burden on standard CMOS foundry process.

DESCRIPTION OF THE DRAWINGS

The detailed description will refer to the following drawings, wherein like numerals refer to like elements, and wherein:

FIGS. 1A-1D illustrate an embodiment of a silicon oxide nitride oxide silicon (SONOS) non-volatile memory (NVM) semiconductor device structure or stack that may be integrated into a standard complementary metal oxide semiconductor (CMOS) foundry process flow;

FIGS. 2A-B, 3A-B, 4A-B, and 5A-B illustrate an embodiment of a method to fabricate a CMOS silicon wafer with an embedded SONOS NVM.

DETAILED DESCRIPTION

Non-volatile memory (NVM) stores a bit of information in an on-chip semiconductor memory cell and preserves the memory state whenever power is removed from the memory cell. Many electrical, magnetic, and physical methods exist for storing this bit in semiconductor NVM chips. For example, charge storage may be used. Semiconductor NVMs that use charge storage as the memory mechanism typically utilize one of two physical device structures referred to as "floating gate" and silicon oxide nitride oxide silicon (SONOS).

An embodiment of a method is disclosed to integrate SONOS NVMs, and the fabrication of SONOS NVMs, into a conventional complementary metal oxide semiconductor (CMOS) semiconductor foundry process flow. An embodiment of the method only adds a few additional steps to a standard CMOS foundry process flow and makes minor changes to the rest of the baseline CMOS foundry process flow to form a new process module that includes both CMOS devices and an embedded SONOS NVM.

Figure 1D:
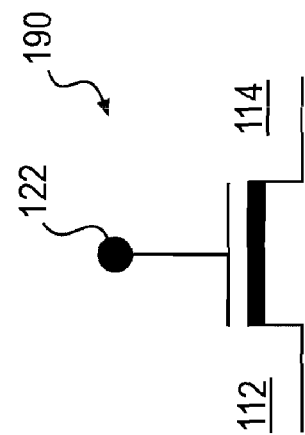
Figure 1C:
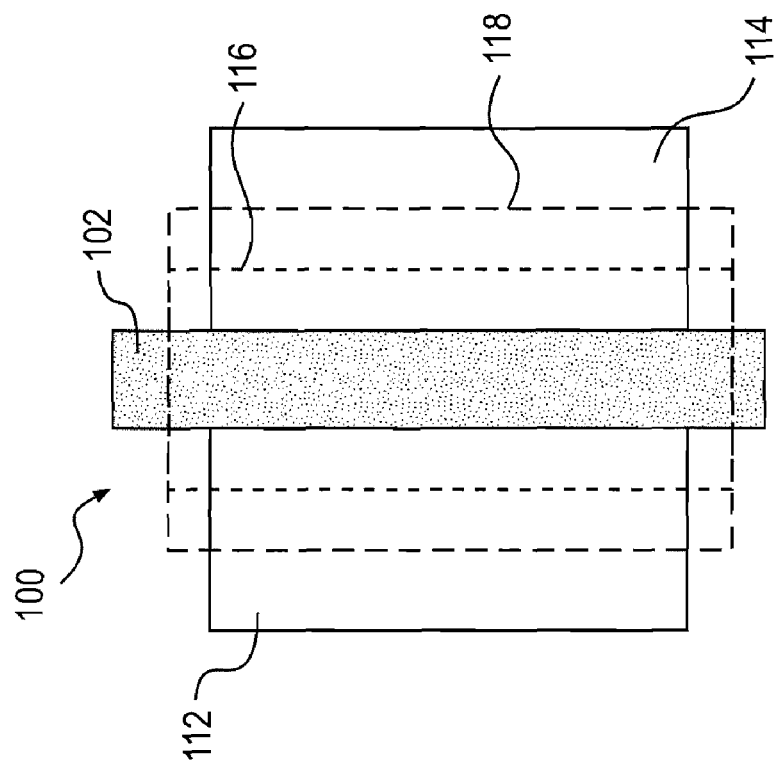

FIGS. 1A-1D illustrate an embodiment of an embedded SONOS NVM semiconductor device structure or stack 100 (also referred to as embedded SONOS NVM 100) that may be integrated into a standard CMOS foundry process flow. Specifically, FIG. 1A shows a detailed embedded SONOS NVM cross-section, FIG. 1B shows a simplified embedded SONOS NVM cross-section, FIG. 1C shows a top view of the embedded SONOS NVM 100, and FIG. 1D shows an embodiment of an embedded SONOS NVM transistor 190 that includes a gate electrode 122, a source electrode 112, and a drain electrode 114.

Referring to FIGS. 1A and 1B, the embedded SONOS NVM 100 includes a gate polysilicon layer 102 (also referred to as gate poly layer), a capping oxide layer 108, an oxynitride (or nitride) charge storage layer 104 (also referred to as oxynitride (or nitride) layer or charge storage layer), and a tunnel oxide layer 110. The capping oxide layer 108 is located on top of the oxynitride layer charge storage layer 104. Similar to a conventional metal oxide semiconductor (MOS) device, doped N+ regions are used to form the source electrode 112 and drain electrode 114, and underneath the tunnel oxide is the doped (silicon) channel region 120. A memory window implant layer 106 is located below the tunnel oxide layer 110.

Many floating gate devices store charges within a conductive polysilicon film in a gate dielectric while a SONOS device stores charges within the oxynitride charge storage layer 104 in the gate dielectric. Threshold voltages of SONOS devices are modulated by the presence of positive or negative charge within this charge storage layer 104. Low and high threshold voltage states may be assigned logic values in order to store a bit of data in the memory cell (e.g., the high threshold voltage is often referenced as a logic one while the low threshold voltage is the logic zero).

The SONOS memory cell (e.g., bit) may be programmed by applying a large positive voltage to the gate electrode. This causes electrons (i.e., negative charges) to quantum mechanically tunnel through the tunnel oxide layer 110, which is typically 18 to 20 Angstroms (Å) thick. The electrons are then trapped in the oxynitride charge storage layer 104, which shifts the threshold voltage of the SONOS device positively. The capping oxide layer 108 functions as an insulator to prevent charge injection from the conductive polysilicon gate layer 102 to the oxynitride charge storage layer 104.

Figure 1E:
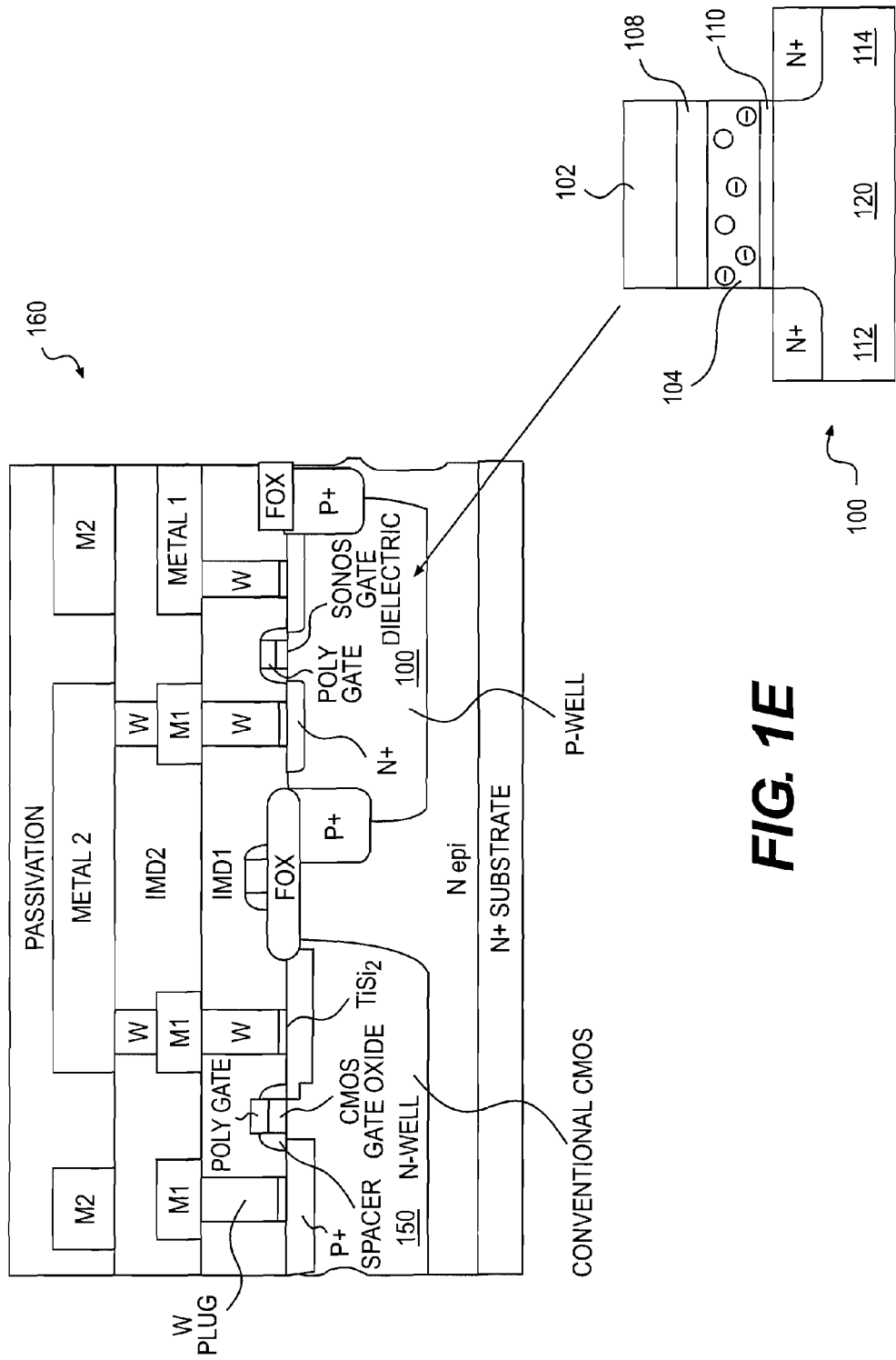
FIG. 1E shows the SONOS NVM of FIGS. 1A-1D co-existing on the same semiconductor substrate with a standard CMOS device.

FIG. 1E shows the embedded SONOS NVM 100 co-existing on the same semiconductor substrate 160 with a standard CMOS device 150. As noted above, it is important to minimize the number of additional process steps needed to build the SONOS structure. Therefore, it is preferable to share as many process steps in the standard CMOS foundry process flow and only add a few extra steps, while minimizing any additional changes that need to be made to the rest of the process flow to accommodate the SONOS process module.

An embodiment of a method for integrating SONOS NVM into a standard CMOS foundry process flow adds, for example, two extra masking (i.e., photolithographic) steps to a typical CMOS foundry process flow, which typically includes twenty or more masking steps. The two extra masking steps are, for example, a memory window implant masking step and a stack removal masking step.

FIG. 1C shows a simplified physical layout illustrating the placement of a memory window implant mask 116 and a stack removal mask 118 (also referred to as stack removal photoresist mask) that are used in these two masking steps. The purpose of the memory window implant masking step is to selectively set the threshold voltage of the SONOS transistor (using a separate ion implant step). The stack removal masking step uses a stack removal photoresist layer 402 (shown in FIG. 4A) defined by the stack removal mask 118 to allow the tunnel oxide layer 110, the oxynitride layer 104, and the capping oxide layer 108 (collectively referred to as a SONOS stack) to be selectively removed from all regions of the silicon wafer, except for the SONOS memory cell regions.

FIGS. 2A-B, 3A-B, 4A-B, and 5A-B illustrate steps of an embodiment of a method to fabricate a CMOS silicon wafer with an embedded SONOS NVM (also referred to as a SONOS process module sequence).

Referring to FIG. 2A, in an embodiment, a first step 200 of the SONOS process module sequence may take place immediately after threshold voltage adjustment implants in the overall baseline CMOS foundry process flow. In step 200, the memory window implant layer 106 may be patterned using memory window implant photoresist 202 and the memory window implant layer 106 defined by the memory window implant mask 116 (shown in FIG. 2B), forming patterned SONOS memory cell regions. Next, ions may be implanted through a scatter oxide layer 204 (arrows 210) to set the threshold voltage.

FIG. 2B shows a top view of an outline of the memory window implant mask 116 in step 200.

Referring to FIG. 3A, in another step 300 of the SONOS process module sequence, with the photoresist 202 still on wafers (which include the scatter oxide layer 204, the memory window implant layer 106, and the doped silicon channel region 120), the wafers may be wet etched (i.e., stripped) to remove the scatter oxide layer 204 in a memory window opening that is defined by the memory window implant mask 116 (shown in FIG. 3B).

Next, the memory window implant photoresist 202 may be stripped and a tunnel oxide layer 110 of, for example, 18 Å, may be grown. Next, an oxynitride layer 104 of, for example, 120 Å may be deposited. Finally, the oxynitride layer 104 may be oxidized to form a capping oxide layer 108 of, for example, 40 Å One skilled in the art will appreciate that other thicknesses of the tunnel oxide layer 110, oxynitride layer 104, and capping oxide layer 108 may also be applied. As noted above, the tunnel oxide layer 110, the oxynitride layer 104, and the capping oxide layer 108 may collectively be referred to as a SONOS stack.

FIG. 3B shows a top view of an outline of the memory window implant mask 116 in step 300.

Referring now to FIG. 4A, in another step 400 of the SONOS process module sequence, the SONOS stack may be patterned using a stack removal photoresist layer 402 defined by the stack removal photoresist mask 118 (shown in FIG. 4B). A plasma etch (i.e., dry etch) may be used to remove the capping oxide layer 108 and the oxynitride layer 104 from the entire wafer except over the patterned SONOS memory cell regions. The memory window implant mask 116 may be slightly smaller than the stack removal photoresist mask 118 to allow the stack removal etch to stop on the thick scatter oxide layer 204 to avoid any attack of the silicon active layer.

FIG. 4B shows a top view of an outline of the stack removal mask 118 shown in comparison with the memory window implant mask 116 in step 400.

Referring again to FIG. 4A, with the stack removal photoresist layer 402 still on the wafers, the scatter oxide layer 204 over the CMOS gates may be removed using a wet etch. Leaving the stack removal photoresist layer 402 on during the wet strip ensures that the thin capping oxide layer 108 is protected (i.e., not removed). Next, the stack removal photoresist layer 402 may be stripped, which completes the SONOS module.

FIG. 5A shows another step 500 of the SONOS process module sequence. Compared with a conventional CMOS foundry process flow for cleaning silicon wafers immediately prior to gate oxidation, an embodiment of the method for integrating SONOS NVM into a standard CMOS foundry process flow processes the silicon wafers without hydrofluoric acid to ensure that none of the thin capping oxide in the capping oxide layer 108 is removed. This step is called the pre-gate oxide or pre-gate oxidation cleaning step and conventional CMOS foundry processes typically include hydrofluoric acid in this (wet) cleaning step.

After the pre-gate oxide cleaning step, a standard gate oxide layer 502 may be grown and a gate polysilicon layer 102 may be deposited to form the gate electrode 122 for both the SONOS transistors and for the standard CMOS gates.

FIG. 5B shows a top view of the gate polysilicon layer 102 in step 500.

In summary, starting from a standard CMOS foundry process flow, an embodiment of the method for integrating SONOS NVM into a standard CMOS foundry process flow adds only a few steps to form a SONOS NVM device. The SONOS NVM device may share all other front end of the line (FEOL) and back end of the line (BEOL) process steps and device structures, such as wells, isolation, channel implants, poly gate, lightly doped diffusion (LDD), source/drain (S-D), silicide, contact, and interconnect.

Figure 6:
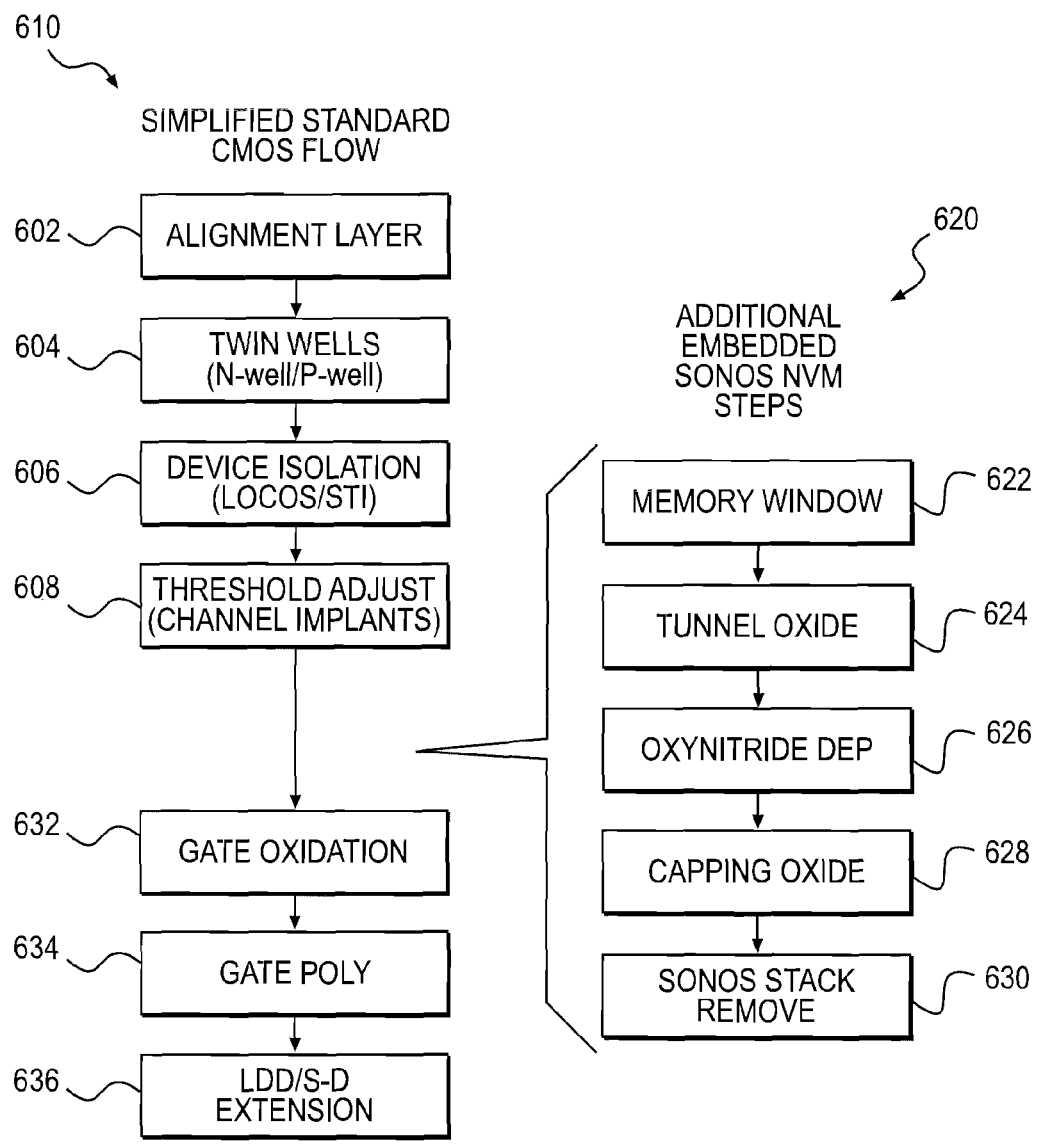
FIG. 6 illustrates an embodiment of a simplified standard CMOS foundry process flow with exemplary additional embedded SONOS NVM steps added.

FIG. 6 is a flowchart illustrating an embodiment of a simplified standard CMOS foundry process flow 610 with exemplary additional embedded SONOS NVM steps 620 added. A simplified standard CMOS foundry process flow 610 includes forming an alignment layer (block 602), forming twin wells (N-well and P-well) (block 604), device isolation (block 606), and threshold adjustment (e.g., channel implants) (block 608). The forming an alignment layer step 602 patterns alignment marks on the silicon wafers for subsequent photolithography processing. The forming twin well step 604 enables complementary NMOS and PMOS devices (CMOS) to be formed on the same silicon substrate in separate doped regions, N-Wells for PMOS and P-Wells for NMOS devices. The device isolation step 606 electrically and physically isolates neighboring MOS devices from each other using silicon dioxide as an insulating material. The threshold adjustment step 608 is typically done using ion implantation to control and optimize MOS device parameters such as threshold voltage and off current. After threshold adjustment (block 608), the additional embedded SONOS NVM steps 620 may be added. The additional embedded SONOS NVM steps 620 may include patterning a memory window implant layer (block 622), growing a tunnel oxide layer (block 624), depositing an oxynitride layer (block 626), forming a capping oxide layer (block 628), and patterning a stack removal photoresist layer defined by a stack removal mask (block 630). Patterning 622 the memory window implant layer may be performed, e.g., as described above with reference to FIG. 2A and step 200 illustrated therein. Growing 624 the tunnel oxide layer may be performed, e.g., as described above with reference to FIG. 3A and step 300 illustrated therein. Depositing 626 the oxynitride layer may be performed, e.g., as described above with reference to FIG. 3A and step 300 illustrated therein. Forming 628 the capping oxide layer may be performed, e.g., as described above with reference to FIG. 3A and step 300 illustrated therein. Patterning 630 the stack removal photoresist layer may be performed, e.g., as described above with reference to FIG. 4A and step 400 illustrated therein.

An embodiment of the simplified standard CMOS foundry process flow 610 with additional embedded SONOS NVM steps 620 then returns to the standard CMOS flow 610 to grow gate oxide (block 632), deposit gate polysilicon (block 634), and perform LDD and/or S-D extension (block 636). The gate oxide and polysilicon gate combine to form the control gate for the NMOS and PMOS transistors. Voltage bias may be applied to the transistor gates to turn the devices on and off. The LDD and/or S-D extension is the doped silicon region that connects the MOS transistor highly doped source and drain regions to the active channel regions directly under the gates.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

What is claimed is:

1. A method for integrating silicon oxide nitride oxide silicon (SONOS) non-volatile memory (NVM) into a standard complementary metal oxide semiconductor (CMOS) foundry process flow, comprising:
    performing standard CMOS foundry process flow, including:
        forming an alignment layer on a silicon substrate;
        forming twin-wells on the silicon wafer to form a plurality of devices on the silicon substrate; and
        isolating neighboring devices on the silicon substrate;
    patterning a memory window implant layer on the silicon substrate using a memory window implant mask; and
    patterning a stack removal photoresist layer using a stack removal photoresist mask, wherein the memory window implant mask is smaller than the stack removal photoresist mask.

2. The method of claim 1, wherein the patterning the memory window implant layer step selectively sets a threshold voltage of a SONOS transistor.

3. The method of claim 1, wherein the stack removal photoresist layer is defined by the stack removal photoresist mask to allow a SONOS stack to be selectively removed from all regions of a silicon wafer except SONOS memory cell regions.

4. The method of claim 3, wherein the SONOS stack includes a tunnel oxide layer, an oxynitride layer, and a capping oxide layer.

5. The method of claim 1, wherein the patterning the memory window implant layer step includes patterning the memory window implant layer using memory window implant photoresist, forming patterned SONOS memory cell regions.

6. The method of claim 5, wherein the patterning the memory window implant layer step further includes performing ion implantation through a scatter oxide layer to set a threshold voltage of a SONOS transistor.

7. The method of claim 6, wherein the patterning the memory window implant layer step further includes, with the memory window implant photoresist still on wafers, wet etching the wafers to remove the scatter oxide layer in a memory window opening defined by the memory window implant mask.

8. The method of claim 7, wherein the patterning the memory window implant layer step further includes stripping the memory window implant photoresist and growing a tunnel oxide layer.

9. The method of claim 8, wherein the patterning the memory window implant layer step further includes depositing an oxynitride layer.

10. The method of claim 9, wherein the patterning the memory window implant layer step further includes oxidizing the oxynitride layer to form a capping oxide layer.

11. The method of claim 10, wherein the patterning the stack removal photoresist layer step includes patterning the SONOS stack using the stack removal photoresist mask.

12. The method of claim 11, wherein the patterning the stack removal photoresist layer step further includes dry etching the wafers to remove the capping oxide layer and the oxynitride layer from the wafers except over the patterned SONOS memory cell regions.

13. The method of claim 12, wherein the patterning the stack removal photoresist layer step further includes, with the stack removal photoresist mask still on the wafers, removing the scatter oxide layer over CMOS gates using a wet etch.

14. The method of claim 13, wherein the patterning the stack removal photoresist layer step further includes stripping the stack removal photoresist mask.

15. A method for forming silicon oxide nitride oxide silicon (SONOS) non-volatile memory (NVM) as part of a standard complementary metal oxide semiconductor (CMOS) foundry process flows, comprising:
    patterning a memory window implant layer using memory window implant photoresist and a memory window implant mask, forming patterned SONOS memory cell regions;
    growing a tunnel oxide layer;
    depositing an oxynitride layer
    forming a capping oxide layer;
    patterning a stack removal photoresist layer defined by a stack removal photoresist mask, wherein the memory window implant mask is smaller than the stack removal photoresist mask.

16. The method of claim 15, wherein the memory window implant layer is patterned to selectively set a threshold voltage of a SONOS transistor.

17. The method of claim 15, wherein the stack removal photoresist layer allows a SONOS stack to be selectively removed from all regions of a silicon wafer except SONOS memory cell regions.

18. The method of claim 15, wherein the patterning the memory window implant layer step includes performing ion implantation through a scatter oxide layer to set a threshold voltage of a SONOS transistor.

19. The method of claim 18, wherein the patterning the memory window implant layer step further includes, with the memory window implant photoresist still on wafers, wet etching the wafers to remove the scatter oxide layer in a memory window opening defined by the memory window implant mask.

20. The method of claim 19, wherein the patterning the stack removal photoresist layer step further includes:
    dry etching the wafers to remove the capping oxide layer and the oxynitride layer from the wafers except over the patterned SONOS memory cell regions;
    with the stack removal photoresist mask still on the wafers, removing the scatter oxide layer over CMOS gates using a wet etch; and
    stripping the stack removal photoresist mask.

* * * * *

UNITED STATES PATENT AND TRADEMARK OFFICE
CERTIFICATE OF CORRECTION

PATENT NO. : 8,258,027 B2
APPLICATION NO. : 12/941645
DATED : September 4, 2012
INVENTOR(S) : Smith et al.

Page 1 of 1

It is certified that error appears in the above-identified patent and that said Letters Patent is hereby corrected as shown below:

In the Claims

In col. 6, line 31, claim 15, after "oxynitride layer" insert --;--.

Signed and Sealed this
Nineteenth Day of November, 2013

Teresa Stanek Rea
*Deputy Director of the United States Patent and Trademark Office*